(12) United States Patent
Ezzeddine

(10) Patent No.: US 8,203,416 B2
(45) Date of Patent: Jun. 19, 2012

(54) PLANAR INDUCTIVE STRUCTURE

(75) Inventor: Hilal Ezzeddine, Tours (FR)

(73) Assignee: STMicroelectronics S.A., Montrouge (FR)

( * ) Notice: Subject to any disclaimer, the term of this patent is extended or adjusted under 35 U.S.C. 154(b) by 91 days.

(21) Appl. No.: 12/124,940

(22) Filed: May 21, 2008

(65) Prior Publication Data

US 2009/0066461 A1 Mar. 12, 2009

(30) Foreign Application Priority Data

May 23, 2007 (FR) ...................................... 07 55212
May 20, 2008 (EP) ...................................... 08156510

(51) Int. Cl.
*H01F 5/00* (2006.01)
*H01F 27/29* (2006.01)
*H01F 27/28* (2006.01)
*H03H 5/00* (2006.01)

(52) U.S. Cl. ........ 336/200; 336/192; 336/223; 336/232; 333/25

(58) Field of Classification Search ................... 336/192, 336/200, 223, 232; 333/25
See application file for complete search history.

(56) References Cited

U.S. PATENT DOCUMENTS

| 5,521,573 | A | * | 5/1996 | Inoh et al. ...................... 336/180 |
| 5,942,965 | A | * | 8/1999 | Kitamura et al. ............. 336/200 |
| 6,114,937 | A |   | 9/2000 | Burghartz et al. |
| 6,606,022 | B1 |  | 8/2003 | Taurand |
| 2005/0264273 | A1 | * | 12/2005 | Ezzedine ...................... 323/355 |
| 2006/0103484 | A1 | * | 5/2006 | Ezzeddine .................... 333/118 |

FOREIGN PATENT DOCUMENTS

| BE | 431 839 | | 1/1939 |
| EP | 0 649 152 | A2 | 4/2005 |
| JP | 05 275247 | A | 10/1993 |
| JP | 2002 280230 | A | 9/2002 |

OTHER PUBLICATIONS

French Search Report from French Patent Application 07/55212 dated Feb. 29, 2008.

* cited by examiner

*Primary Examiner* — Anh Mai
*Assistant Examiner* — Ronald Hinson
(74) *Attorney, Agent, or Firm* — Wolf, Greenfield & Sacks, P.C.

(57) ABSTRACT

A spiral structure having at least one planar winding in at least one first conductive level to form at least one inductive element, wherein the winding is surrounded with a conductive plane and at least one track is formed in a second conductive level and has two ends connected by conductive vias to the plane of the first level, at diametrically opposite positions with respect to the center of the winding.

14 Claims, 5 Drawing Sheets

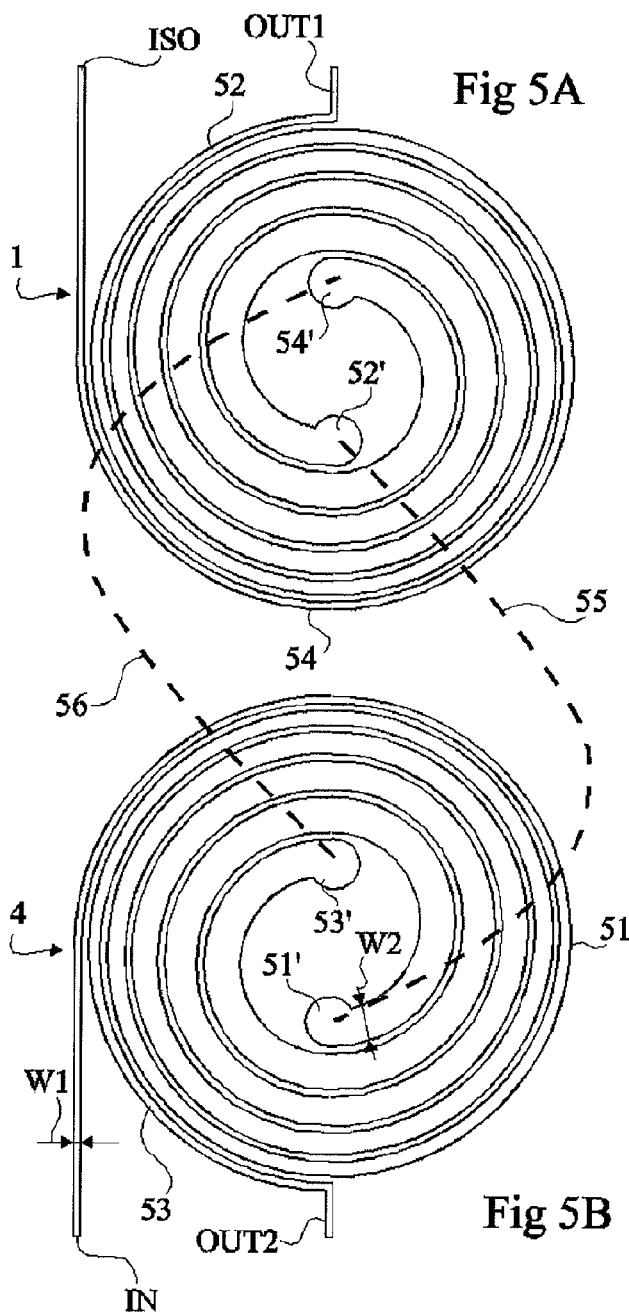
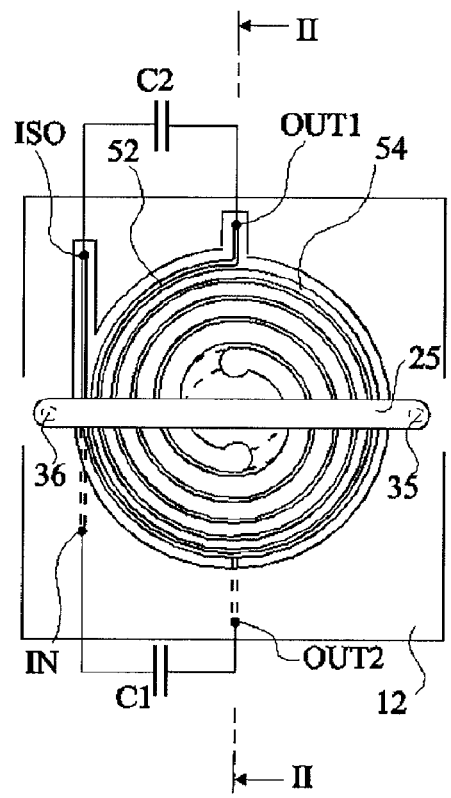
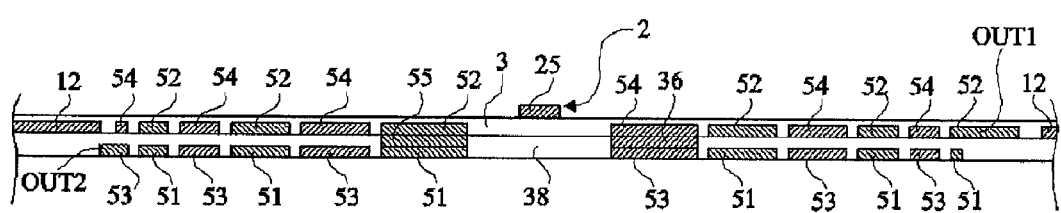
Fig 5A
Fig 5B
Fig 6
Fig 7

PLANAR INDUCTIVE STRUCTURE

BACKGROUND OF THE INVENTION

1. Field of the Invention

The present invention generally relates to the forming of inductive elements by using integrated circuit and printed circuit manufacturing technologies. The present invention more specifically relates to the forming of planar inductive windings.

2. Discussion of the Related Art

A planar inductive winding is formed by a spiral-shaped conductive track in a conductive level of an integrated circuit or of a printed circuit. Most often, the spiral structure is, in the plane, surrounded with a surface intended to be connected to ground (the ground plane). According to applications, several spiral windings may be interdigited in a same plane and several windings or pairs of windings may be superposed in different conductive levels to form coupled structures.

A problem which is made more and more critical by miniaturization needs is a significant temperature rise at the center of the spiral structure. This temperature rise may result in a deterioration of the structure or require an increase in the width of the conductive track, which goes against the desired miniaturization.

SUMMARY OF THE INVENTION

An object of the present invention is to overcome all or part of the disadvantages of usual spiral structures.

Another object is the forming of a spiral structure having an improved thermal behavior with respect to a usual structure having tracks of same widths.

Another object is a spiral structure more specifically intended to be surrounded by a conductive plane.

To achieve all or part of these and other objects, an embodiment of the present invention provides a spiral structure comprising at least one planar winding in at least one first conductive level to form at least one inductive element, wherein:

said winding is surrounded with a conductive plane; and at least one track is formed in a second conductive level and has two ends connected by conductive vias to the plane of the first level, at diametrically opposite positions with respect to the center of the winding.

According to an embodiment, said conductive track is continuous from one end to the other.

According to an embodiment, said conductive track is interrupted at the center of the winding.

According to an embodiment, the width of the conductive track is, at the center of the winding, smaller than or equal to one third of the internal diameter of the winding.

According to an embodiment, said conductive plane is intended to be connected to a reference voltage.

According to an embodiment, several conductive tracks are distributed in the second conductive level by having their respective ends connected to the conductive plane of the first level.

According to an embodiment, at least one second winding is formed in a third conductive level superposed to the first two.

According to an embodiment, two interdigited planar windings are formed in the first level.

According to an embodiment, the width of the conductive track is greater at the center of the structure than at its ends intended to be connected to the conductive plane of the first level.

The present invention also provides an inductive element comprising such a structure.

The present invention also provides a combiner/divider in distributed lines comprising:

a first line formed of a first planar winding in a first conductive level and of a second planar winding in a third conductive level; and a second line formed of a third planar winding interdigited with the first winding in the first level, and of a fourth planar winding interdigited with the second winding in the third level, a conductive track in accordance with the above structure being formed in a second conductive level superposed to the other two.

According to an embodiment, the windings have a width increasing from the inside to the outside.

The foregoing and other objects, features, and advantages of the present invention will be discussed in detail in the following non-limiting description of specific embodiments in connection with the accompanying drawings.

BRIEF DESCRIPTION OF THE DRAWINGS

FIGS. 5A and 5B are top views of conductive levels taking part in an integrated embodiment of coupled lines of the combiner/divider of FIG. 4;

FIG. 6 is a top view of an embodiment of the combiner/divider of FIG. 4;

FIG. 7 is a cross-section view along line II-II of FIG. 6;

DETAILED DESCRIPTION

Figure 1:
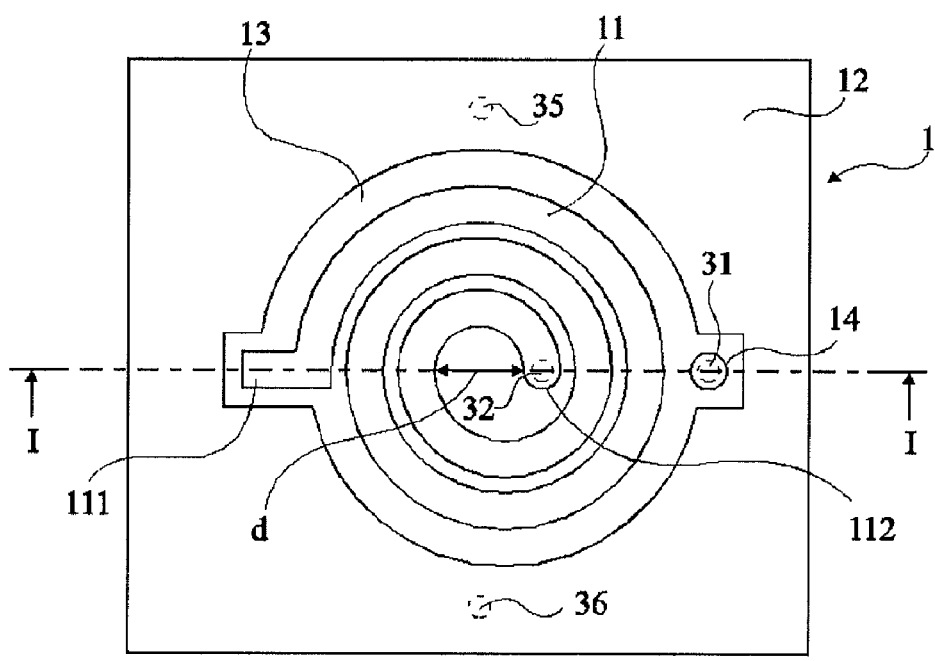
FIG. 1 is a top view of a conductive level of an embodiment of a spiral inductance structure.

The same elements have been designated with the same reference numerals in the different drawings and, further, as usual in the representation of integrated circuits, the various drawings are not to scale.

For clarity, only those steps and elements which are useful to the understanding of the present invention have been shown and will be described. In particular, the applications of a spiral structure have not all been detailed, such a structure being usable to replace a usual structure in any application. Similarly, the methods for forming thin layers by using integrated circuit manufacturing technologies have not been detailed, since usual techniques can be implemented.

Figure 2:
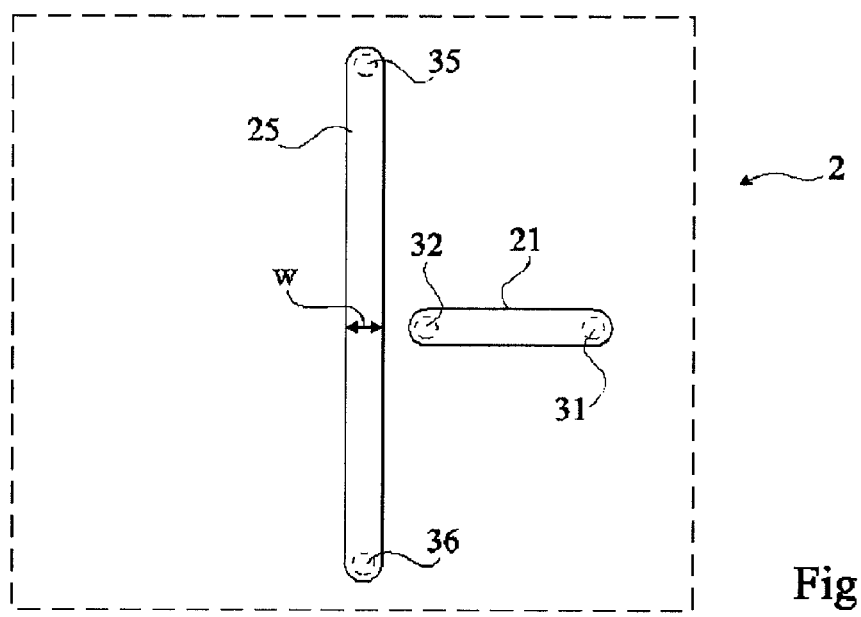
FIG. 2 is a top view of another conductive level of the structure of FIG. 1.
Figure 3:
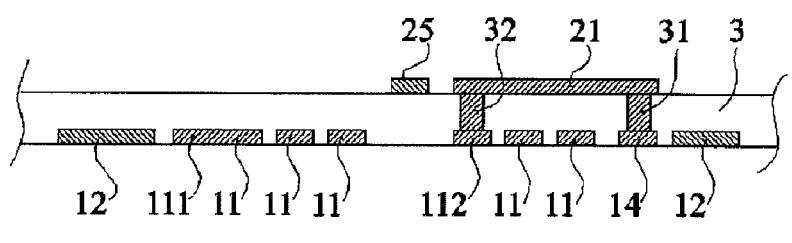
FIG. 3 is a cross-section view of the structure of FIGS. 1 and 2 along line I-I of FIG. 1.

FIGS. 1, 2, and 3 show, respectively in top view (FIGS. 1 and 2) and in cross-section view (FIG. 3), an inductance made in the form of a spiral structure by means of two conductive levels 1 (FIG. 1) and 2 (FIG. 2), separated from each other by an insulating layer 3 (FIG. 3).

The inductive element is formed of a planar winding 11 made in a conductive level 1 by being surrounded with a conductive plane 12. In other words, winding 11 is formed in an opening 13 of conductive plane 12. Plane 12 is, for example, intended to be connected to a reference voltage, for example, the ground. In the shown example, a first external end 111 of winding 11 is intended to be connected to a first element of an electronic circuit (not shown) while a second internal end 112 is intended to be connected to a second element of the electronic circuit. If need be, to have internal end 112 of the inductive winding come out, a conductive track 21 is used (FIG. 2), for example, in conductive level 2. This track is for example rectilinear and has its two ends connected by vias 31 and 32 respectively to a conductive pad 14 made in opening 13 or in another opening of plane 12 of level 1, and to end 112 of winding 11 in level 1. The respective connections of end 111 and of pad 14 to the rest of the electronic circuit are performed, for example, in another conductive level (not shown) by means of vias, or by wire connections. In the shown example, it is assumed that these connections are performed at the bottom of the structure of FIG. 3, level 1 being assumed to be the lowest level. The inverse is of course possible with level 2 being buried and level 1 above. Similarly, track 21 may be located in another level than level 2.

Conductive level 2 comprises a conductive track or bridge 25 crossing the spiral structure to connect, by its two ends, plane 12. In the shown example, bridge 25 is perpendicular to track 21. Its two ends are connected by vias 35 and 36 to ground plane 12 of conductive level 1.

The presence of conductive bridge 25 connecting ground plane 12 in the second level enables improving the thermal behavior of the spiral structure by capturing the heat of the winding and more specifically that generated at its center to remove it through the ground plane to which thermal bridge 25 is connected. Advantage is taken of the current density distribution in a conductive winding which is greater at the center of the winding than at the periphery.

To avoid degrading the electric performances (in particular the quality factors) of the inductive element, width W (FIG. 2) of heat transfer track 25 is smaller than or equal to one third of internal diameter d (FIG. 1) of the spiral structure.

Preferably, bridge 25 is as narrow as possible. The impact on the electric performances of the inductive structure is then minimum while the heat removal is ensured.

If more than two levels are used, track 25 is preferably formed in the level closest to the winding (above or under) to promote the heat transfer.

Figure 4:
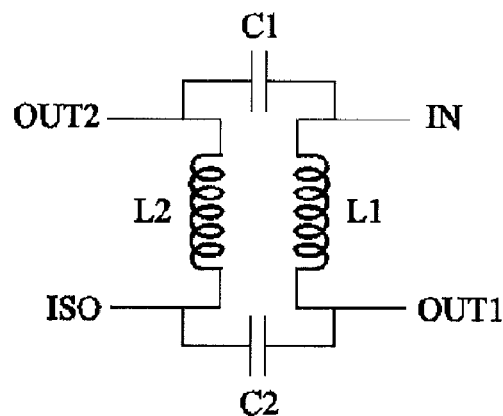
FIG. 4 shows the equivalent electric diagram of an embodiment of a combiner/divider.

FIG. 4 shows the equivalent electric diagram of a combiner/divider capable of being formed by means of a thermal bridge spiral structure.

A combiner/divider comprises an access IN, arbitrarily designated as an input, intended to receive a signal, the power of which is to be distributed (or to provide a combined signal) and two accesses OUT1 and OUT2, arbitrarily designated as outputs, intended to provide distributed power signals (or to receive signals, the powers of which are to be combined). This circuit not only has the function of equally distributing the input power between the output accesses in phase or in phase quadrature, but also to ensure the isolation between these accesses. Such a device is most often directional, that is, it can be used according to its assembly in an electronic circuit to combine two powers into a single signal or to equally distribute a power into two equal powers. A first inductive element L1 connects so-called combined access terminal IN to one, for example OUT1, of the so-called distributed access terminals. A second inductive element L2 connects a second distributed access terminal OUT2 to a terminal ISO generally left floating. According to whether terminal OUT2 is on the side of terminal IN or on the side of terminal OUT1, the distributed accesses are in phase quadrature or in phase. In certain cases, terminal ISO is not left floating but is charged by a standardized impedance (typically, 50 ohms). The combiner then becomes directional, that is, a signal input through terminal IN (generally connected to an antenna) is trapped by terminal ISO to avoid that this signal reaches the application (typically, the amplifier or a radio-frequency transmission or reception chain). To obtain a combiner/divider effect, the formed coupler must be at 3 dB so that the power of terminal IN is distributed by halves on each of terminals OUT1 and OUT2.

In the example of FIG. 4, the ends defining accesses IN and OUT2 are connected by a first capacitive element C1 while the ends defining accesses OUT1 and ISO are connected to a second capacitive element C2. The function of capacitive elements C1 and C2 is to increase the coupling between lines without modifying their impedance. Another effect of the capacitive elements provided on both sides is to make the structure symmetrical.

FIGS. 5A, 5B, 6, and 7 illustrate an embodiment of inductive elements L1 and L2 in the form of a spiral structure of planar conductive windings. FIGS. 5A and 5B are simplified views of two conductive levels 1 and 4 for this embodiment. FIG. 6 is a top view illustrating the stacked levels of FIGS. 5A and 5B as well as another conductive level in which is formed a heat transfer bridge. FIG. 7 is a cross-section view along line II-II of FIG. 6.

In this example, the coupled lines of the combiner/divider are made in the form of planar windings in levels 1 and 4, stacked on each other, each level comprising two interdigited windings. The tracks are further of increasing width from the outside of each winding to the center. This increasing width further improves the thermal behavior of the structure. Thus, by providing an increasing width towards the center of the winding, a combiner/divider of decreased bulk for a given current with respect to an embodiment of constant track width can be sized. This thermal behavior improvement effect then adds to the effect of a track 25 (FIG. 6) formed in conductive level 2.

As illustrated in FIGS. 5A and 5B, inductive element L1 is formed of two planar windings 51 and 52 formed in levels 1 and 4 which are superposed and separated by an insulator 38 (FIG. 7). Inductive element L2 is also formed of two planar windings 53 and 54, respectively in levels 1 and 4. Winding 53 is interdigited (interlaced) with winding 51 while winding 54 is interdigited with winding 52. The external ends of windings 51, 52, 53, and 54 respectively define accesses IN, OUT1, OUT2, and ISO. Internal ends 51' and 52' of windings 51 and 52 are connected by a conductive via 55 (FIG. 7 and dotted lines in FIGS. 5A and 5B). Internal ends 53' and 54' of windings 53 and 54 are interconnected by a conductive via 56. The stacking order of the conductive levels is indifferent. Other conductive and/or insulating levels, not shown in the drawings, may be provided according to the application.

In the shown example, once the structure is finished (FIG. 6), windings 51 and 53 rotate clockwise, as seen from above and from the outside, while windings 52 and 54 rotate counterclockwise. The contrary is of course possible, provided that the windings forming the same line rotate in reverse directions (from the outside) so that the current of the same line rotates in the same direction along the entire line.

The fact of stacking and interdigiting different windings enables a first coupling effect of the first winding on itself due to the second winding formed in the lower or upper level and a second coupling effect due to the fact that the winding is interdigited with a winding of the other line. This increase in the coupling coefficient enables, among others, the developed lengths of the lines forming the windings to be shorter than one quarter of the wavelength of the work frequency of the coupler. The fact of providing increasing conductive line widths between the line access (width W1, FIG. 5B) and its internal end (width W2) enables, for a given current, decreasing the surface area taken up by the windings. The line widths are preferably the same at all accesses and the same at all internal ends.

As illustrated in FIGS. 6 and 7, a conductive track 25 is formed in conductive level 2 superposed to the other two 1 and 4, for example, by being separated from level 1 by an insulating layer 3. Track 25 is connected by its respective ends and vias 35 and 36 (FIG. 6) to ground plane 12 of level 1. Another heat transfer track may be formed under level 4 (with an interposed insulator) and be connected to plane 12. Each winding level is then associated with a thermal bridge.

To respect the diagram of FIG. 4, optional capacitive elements C1 and C2 (FIG. 6) are formed, for example, in the form of local non-distributed elements. Such capacitive elements improve the coupling between spirals and accordingly the performances of the divider/combiner. Another effect of capacitive elements is to set the operating frequency band of the combiner.

In the embodiment illustrated in FIGS. 4 to 7, the number of turns of each conductive level 1 and 2 differ by one quarter of a turn. This enables making the external ends of the windings defining the combiner/divider accesses closer to one another. It is then possible to connect capacitive elements C1 and C2 to ends as illustrated in FIG. 6 without lengthening the coupled lines. An advantage is that this enables not having long connections to connect the capacitances and thus decreases the risk of degradation of the combiner performances.

The bandwidth of the combiner/divider depends on the number of turns of the windings (and thus on the value of the inductance) as well as on the value of the associated capacitive elements. For a given work frequency (central frequency of the bandwidth of the combiner/divider), the shorter the windings, the higher the values of the associated capacitive elements. In high-frequency applications (over 100 megahertz) particularly aimed at by this embodiment, the capacitive elements will have values ranging between 0.1 and 10 picofarads.

Figure 8:
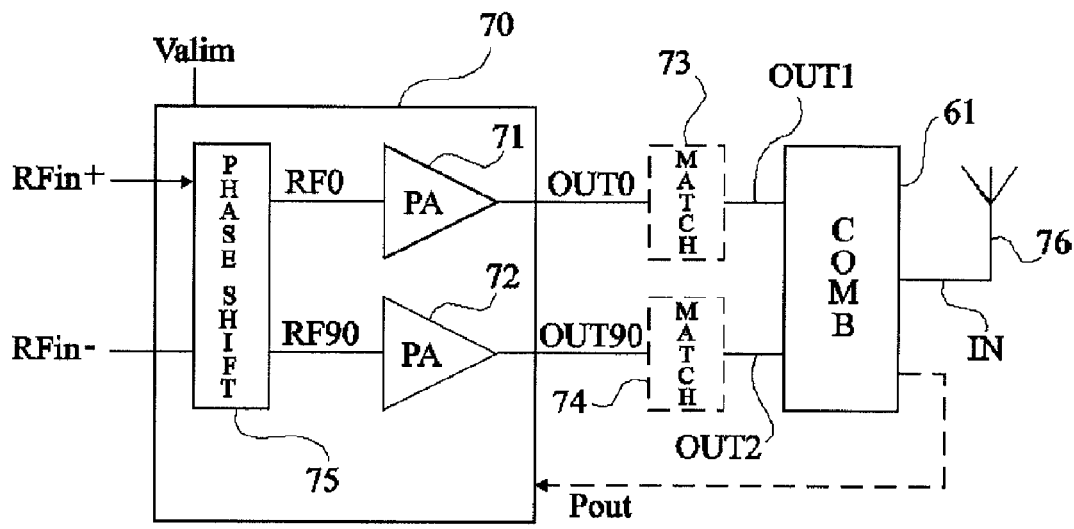
FIG. 8 is a block diagram of an example of an electronic circuit using inductive structures formed by planar windings.

FIG. 8 is a block diagram of a radio-frequency transmission circuit using planar winding structures capable of being formed according to one of the described embodiments. In the example, a combiner 61 is interposed between outputs OUT0 and OUT90 phase-shifted by 90° with respect to each other of two power amplifiers 71 and 72 (PA) of a radio-frequency transmission head 70. Impedance matching circuits 73 and 74 (MATCH), shown in dotted lines, may be interposed between amplifiers 71 and 72 and accesses OUT1 and OUT2 of combiner 61. Each amplifier 71, 72 receives a radio-frequency signal RF0, RF90 originating from a phase shift circuit 75 (PHASE SHIFT) which itself receives two differential radio-frequency signals RFIN+ and RFIN− to be transmitted. Signals RFIN+ and RFIN− are in phase opposition with respect to each other. Circuit 70 is powered by a generally D.C. voltage Valim. Combiner 61 adds signals OUT0 and OUT90 to form a signal IN sent onto an antenna 76 for transmission.

A coupler, not shown, may be added to the combiner to extract therefrom data proportional to the power POUT transmitted on access IN to possibly adjust the gains of amplifiers 11 and 12. To spare the power consumed by the amplification circuits, the signals are most often distributed into two paths in phase quadrature. This is why the combiners/dividers are generally in phase quadrature for distributed accesses.

The same type of architecture may be used for a receive chain. In this case, the combined access (IN) is used as an input terminal while the two distributed accesses (OUT1 and OUT2) are used as phase-shifted terminals (in phase quadrature) of output towards two receive inputs of a radio-frequency receive head.

Structures of planar windings forming inductive elements may be used to form phase-shifter 75, impedance matchers 73 and 74, combiner 61, and the coupler.

Figure 9:
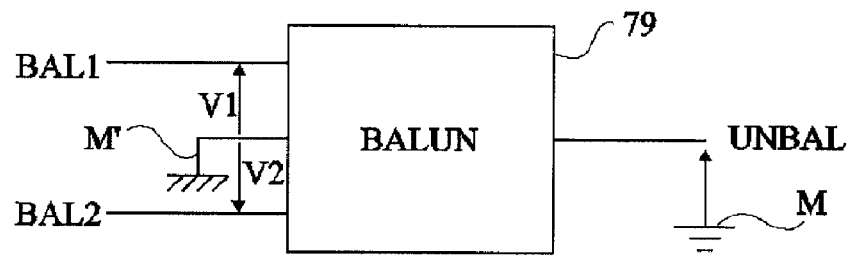
FIG. 9 is a block diagram of an example of a balun using inductive structures formed by planar windings.

FIG. 9 is a block diagram of another example of a circuit 79 likely to be made in lines distributed by planar windings. It is a balun. Such a device is used to transform a common-mode voltage present on an access UNBAL referenced with respect to a ground M into two differential voltages V1 and V2 on accesses BAL1 and BAL2 referenced with respect to a ground M' (identical or different from ground M). A balun may, for example, be in series with a phase-shifter to form a combiner. In a balun, four inductive elements coupled two by two are used. Accordingly, in a planar winding embodiment, two structures of the type shown in FIGS. 5 to 7 are placed side by side or stacked.

Figure 10:
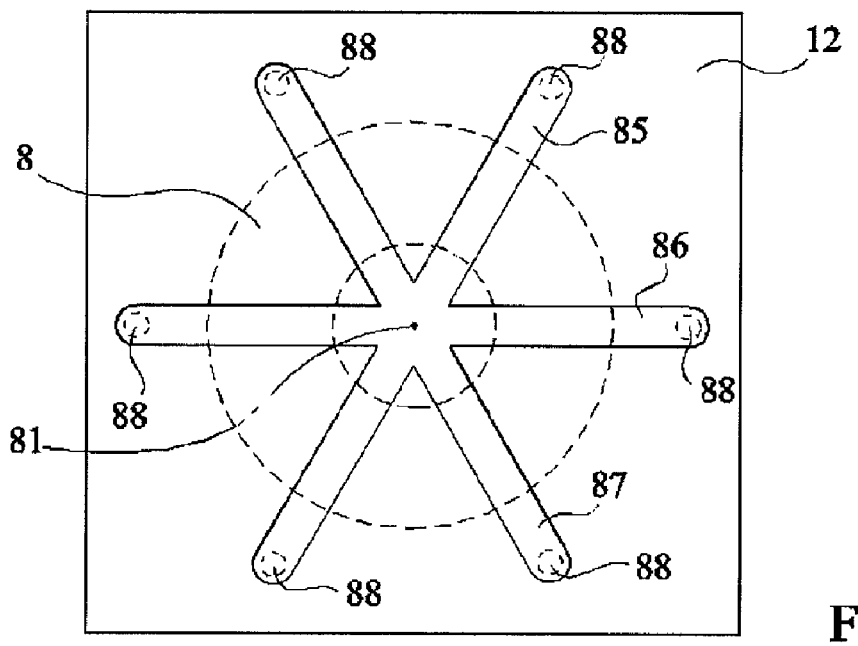
FIG. 10 shows another embodiment of a spiral structure.

FIG. 10 shows another embodiment in which three heat transfer bridges 85, 86, and 87 are provided on a planar spiral structure (shown by its bulk in dotted lines 8) surrounded by a ground plane 12. Elements 85, 86, and 87 are formed in a conductive level different from that or those used to form the spiral structure and cross in their middles, at center 81 of the structure. Their respective ends are connected by vias 88 to ground plane 12.

Increasing the number of thermal bridges enables removing more heat for a same current and thus decreasing the bulk of the spiral structure. However, this is done at the cost of a degradation in electric performances (quality factor for a single inductive element or increased insertion losses for a combiner), so that a compromise will be made according to the application.

Figure 11:
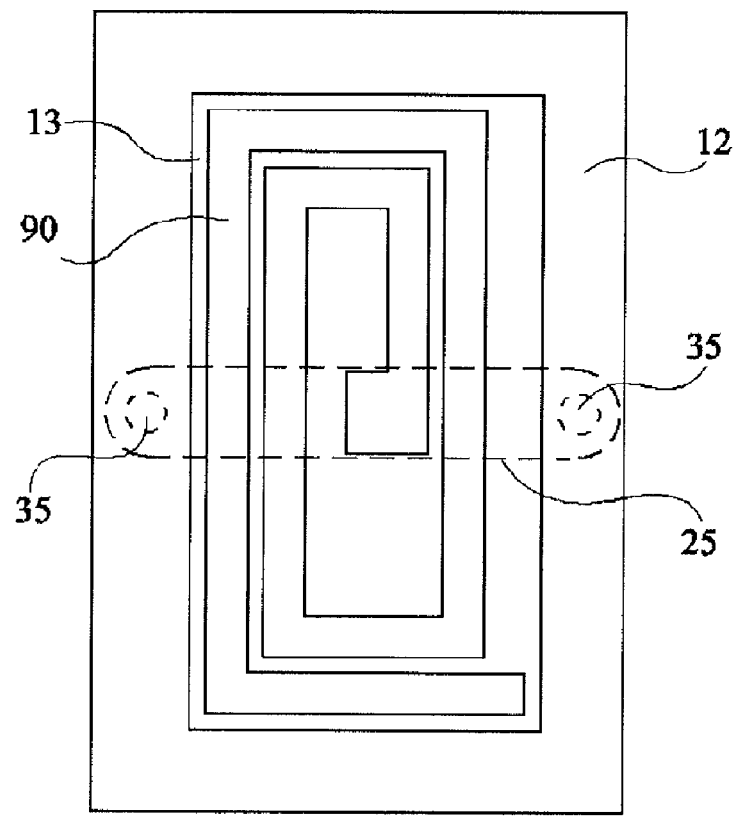
FIG. 11 shows another embodiment still of a spiral structure.

FIG. 11 is a top view of another embodiment in which the spiral structure, formed within an opening 13 of ground plane 12, is a planar winding 90 of square shape. In FIG. 11, heat transfer track 25 has been shown in dotted lines.

Figure 12:
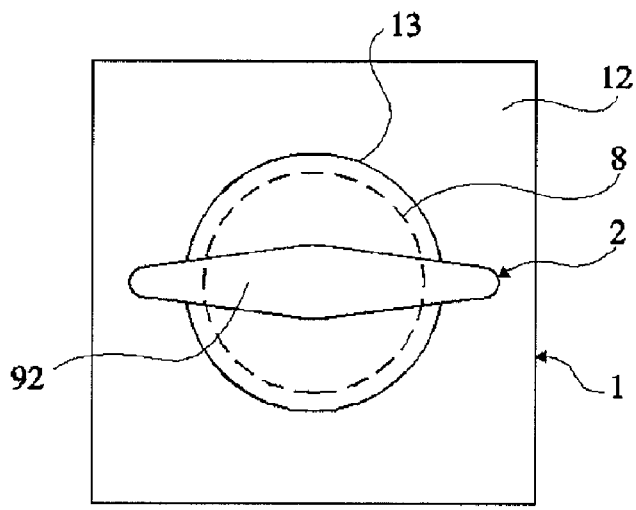
FIG. 12 illustrates a variation of a heat transfer track.
Figure 13:
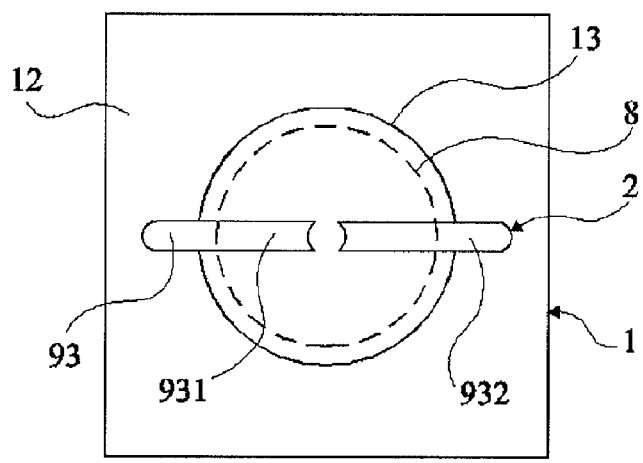
FIG. 13 illustrates another variation of a heat transfer track.
Figure 14:
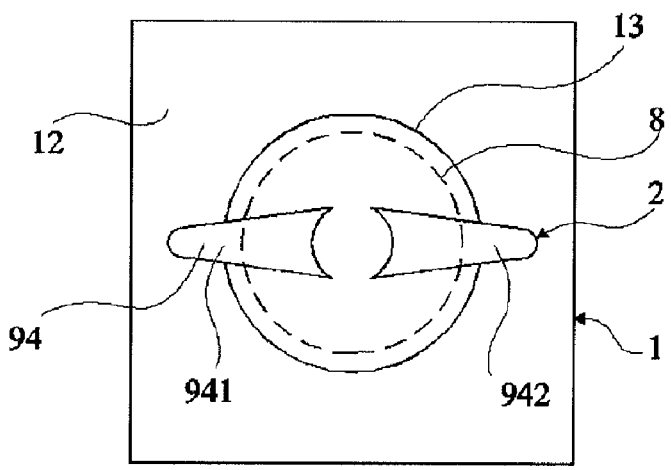
FIG. 14 illustrates still another variation of a heat transfer track.

FIGS. 12, 13, and 14 are simplified top views illustrating alternative embodiments of the thermal bridge of a spiral structure. To simplify the representation of FIGS. 12 to 14, the bulk of the spiral structure has been illustrated by dotted lines 8 in a circular opening 13 of ground plane 12 while, in practice, opening 13 most often defines at least one space (see FIGS. 1 and 6) for a contact recovery of at least one end of a winding. Further, the possible contact recoveries of internal ends of the windings in one of the shown levels or in another one have not been illustrated.

The variation of FIG. 12 illustrates a track 92 which is not rectilinear but wider at the center of the spiral winding than at the ends of connection to the ground plane. This embodiment enables improving the heat removal of the center of the structure with respect to its periphery having lesser needs and thus disturbs less the electric features of the inductive structure.

FIG. 13 illustrates another variation in which a track 93 is interrupted at its center so that it is formed of two sections 931 and 932 each connected by a first end to ground plane 12 outside of structure 8 and having its other end left floating close to the center of structure 8.

FIG. 14 illustrates another variation combining the variations of FIGS. 12 and 13, that is, a heat transfer track 94 formed of two sections 941 and 942 wider at the center of the spiral structure than at the ends connected to ground plane 12.

Specific embodiments of the present invention have been described. Various alterations and modifications will occur to those skilled in the art. In particular, the adaptation of the dimensions (in particular, of the width) of the heat transfer track, or heat transfer tracks, according to the concerned inductive planer winding structure, is within the abilities of those skilled in the art based on the functional indications given hereabove.

Further, the order of the stacked conductive levels also depends on the application and, in particular, on the levels in which the external contacts need to be taken out towards the rest of the electronic circuit.

Further, although reference has been made to a reference plane, it may more generally be any conductive plane, be it or not connected to a potential, its function being to promote the heat dissipation.

Finally, although the thermal bridge has been described as symmetrical with respect to the structure center, one of its sections or sides may be longer than the other, for example, according to the shape of opening 13 in the ground plane.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A spiral structure comprising at least one planar winding in a first conductive level to form at least one inductive element, wherein:
    said at least one planar winding is completely surrounded in the first conductive level by a continuous monolithic conductive material within the first conductive level; and
    at least one conductive track formed in a second conductive level, the at least one conductive track being free of connection from the at least one planar winding in the first conductive level and the at least one conductive track having two ends that are connected by conductive vias to the continuous monolithic conductive material of the first conductive level, wherein the two ends are at diametrically opposite positions with respect to a center region of the at least one planar winding.

2. The structure of claim 1, wherein said conductive track is continuous from one end to the other.

3. The structure of claim 1, wherein said conductive track is interrupted at the center region of the at least one planar winding.

4. The structure of claim 1, wherein a width of the conductive track is, at the center region of the at least one planar winding, smaller than or equal to one third of an internal diameter of the at least one planar winding.

5. The structure of claim 1, wherein said conductive material is connected to a reference voltage.

6. The structure of claim 1, wherein a plurality of conductive tracks are distributed in the second conductive level by having their respective ends connected to the conductive material of the first conductive level.

7. The structure of claim 1, wherein at least one second winding is formed in a third conductive level superposed to the first and second conductive levels.

8. The structure of claim 1, wherein two interdigited planar windings are formed in the first conductive level.

9. The structure of claim 1, wherein a width of the conductive track is greater at a center portion of the spiral structure than at ends of the conductive track, wherein the ends of the conductive track are intended to be connected to the conductive material of the first conductive level.

10. A combiner/divider in distributed lines including a spiral structure comprising at least one planar winding in a first conductive level to form at least one inductive element, wherein:
    said at least one planar winding is surrounded by a conductive plane in the first conductive level;
    at least one conductive track formed in a second conductive level, the at least one conductive track being free of connection from the at least one planar winding and the at least one conductive track having two ends that are connected by conductive vias to the first conductive level, wherein the two ends are at diametrically opposite positions with respect to a center region of the at least one planar winding, and further comprising:
    a first line formed of a first planar winding in the first conductive level, and the first line formed of a second planar winding in a third conductive level; and
    a second line formed of a third planar winding interdigited with the first planar winding in the first conductive level, and the second line formed of a fourth planar winding interdigited with the second winding in the third conductive level,
    wherein the at least one conductive track formed in the second conductive level is superposed to the first and third conductive levels.

11. The combiner/divider of claim 10, wherein the planar windings each have a width that is greater at an inside region than an outside region.

12. The structure of claim 1, wherein the at least one conductive track is conductively connected only to the conductive material of the first conductive level.

13. The structure of claim 1, further comprising at least one second conductive track formed in the second conductive level, the at least one second conductive track connected to the at least one planar winding in the first conductive level.

14. The structure of claim 13, wherein the at least one second conductive track formed in the second conductive level is free of connection from the continuous monolithic conductive material of the first conductive level.

* * * * *